United States Patent
Ru

(10) Patent No.: US 7,100,270 B2
(45) Date of Patent: Sep. 5, 2006

(54) METHOD OF FABRICATING A THIN FILM INTEGRATED CIRCUIT WITH THICK FILM RESISTORS

(75) Inventor: Shao-Pin Ru, Taipei (TW)

(73) Assignee: Tong Hsing Electric Industries Ltd., Taipei (TW)

( * ) Notice: Subject to any disclaimer, the term of this patent is extended or adjusted under 35 U.S.C. 154(b) by 234 days.

(21) Appl. No.: 10/670,416

(22) Filed: Sep. 25, 2003

(65) Prior Publication Data

US 2005/0067188 A1 Mar. 31, 2005

(51) Int. Cl.
*H01C 17/00* (2006.01)

(52) U.S. Cl. .......................... 29/610.1; 29/825; 29/829; 29/846; 29/857; 29/868; 29/874; 174/255; 174/260; 216/16; 216/40; 361/321.4

(58) Field of Classification Search ............... 29/610.1, 29/825, 829, 846, 857, 868, 874; 174/255, 174/260; 216/16, 40; 361/321.4; 427/101; 438/745

See application file for complete search history.

(56) References Cited

U.S. PATENT DOCUMENTS

| | | | | |
|---|---|---|---|---|
| 5,027,253 A | * | 6/1991 | Lauffer et al. | 361/321.4 |
| 5,994,997 A | * | 11/1999 | Brown et al. | 338/309 |
| 6,881,679 B1 | * | 4/2005 | Jo et al. | 438/745 |

* cited by examiner

*Primary Examiner*—A. Dexter Tugbang
*Assistant Examiner*—Tim Phan
(74) *Attorney, Agent, or Firm*—William E. Pelton, Esq.

(57) ABSTRACT

A method of fabricating printed circuit boards integrating thick film resistor components and thin film circuit portions thereon is disclosed. This is a two-phase process, where the first phase is to create multiple thick film resistors, and the second phase is to create a thin film circuit portion on the substrate with thick film resistors in existence, involving the printing of the electrodes and the resistive coating for the thick film resistors, and the printing of a low temperature passivation layer over the resistors; and the thin film circuit is formed by titanium and copper layers over the substrate, and electroplating of interconnections to form copper plated circuit. The present fabrication process does not require drilling of holes nor electroplating of leads to the resistors, thus the whole process can be automated to a greater extent than with conventional techniques.

6 Claims, 5 Drawing Sheets

METHOD OF FABRICATING A THIN FILM INTEGRATED CIRCUIT WITH THICK FILM RESISTORS

BACKGROUND OF THE INVENTION

1. Field of the Invention

The present invention is related to a thin film circuit integrating thick film resistors thereon and a method of fabricating the same, in particular to a method for fabricating a hybrid circuit board with integrated thick film resistors on high density printed circuit boards by a combination of screen printing and copper plating.

2. Description of Related Arts

For printed circuit boards, the current trend is towards high density circuit layouts and planarization of components. It has always been a challenge for circuit board manufacturers to produce high density circuit boards with high efficiency.

A large percentage of components used on hybrid circuit boards are resistors and capacitors. These passive components are conventionally coupled onto printed circuit boards with surface mounting technology (SMT), which are often referred to as SMD resistors and capacitors. However, the main disadvantage of using SMD devices is their high profile. When these SMD devices are coupled onto the circuit boards, the SMD devices tend to stand out from the surface of circuit boards. Therefore, these SMD devices cannot be used in present day compact electronic products due to the space requirements. Furthermore, the surface mounting technology requires the creation of contact pads at predetermined positions on the circuit boards before the resistors and capacitors are mounted, which will increase the process time in the fabrication of printed circuit boards and affect the production efficiency. Therefore, SMD resistors and capacitors are gradually being replaced by thick film resistors and capacitors in the planarization of semiconductor devices.

SUMMARY OF THE INVENTION

The main object of the present invention is to provide a method of fabricating thin film circuits integrated with thick film resistors. The use of thick film resistors to replace SMD resistors allows for the fabrication of integrated thin film circuits, which is able to increase the productivity of printed circuit boards and the yield rate of finished product.

To this end, the instrumentalities of the present invention involve a two-phase process to produce the thin film circuits integrated with thick film resistor components.

The first phase for producing thick film resistor components comprises the acts of:

printing conductive electrodes for thick film resistors, wherein pairs of electrodes are formed at predetermined positions on the surface of an insulating substrate, which will act as the end terminals of thick film resistors;

printing a resistive coating for thick film resistors, wherein a thick layer of resistive material is selectively placed in between pairs of electrodes for forming thick film resistors; and printing a passivation layer, wherein the layer of dielectric is formed over the thick film resistors.

After finishing the formation of thick film resistor components on the insulating substrate, the second phase can be started. The second phase calls for the formation of a thin film circuit portion, comprising the acts of:

forming titanium and copper layers, wherein a titanium layer is first formed over the substrate and then a copper layer is formed thereon, by the sputtering technique, as the thick film resistors are already planted on the substrate;

attaching a dry film over the copper layer;

exposing and developing, wherein a photomask representing the circuit pattern is first placed over the dry film for exposure under ultraviolet rays, and then the dry film over the covered portion is etched away to expose the copper layer underneath;

electroplating the thin film circuit portion for interconnections, wherein the circuit portion undergoes an electroplating process to raise the circuit to an appropriate height; and removing remnants of dry film by lithographic etching, wherein excessive amounts of dry film, copper and titanium materials have to be removed over the substrate to create an integrated thin film circuit incorporating thick film resistors.

Since the thick film resistors are formed on the insulating substrate by screen printing technique, and the thin film circuit is formed by sputtering and copper plating, the integrated printed circuit board is fully planar, and the circuit layout for the circuit board can be more orderly and logical than the conventional methods. Furthermore, in the present invention, there is no need to drill holes on the substrate for electroplating lead wires, thus the process of fabricating printed circuit boards can be automated to a greater extent than it would be otherwise with conventional methods.

The features and structure of the present invention will be more clearly understood when taken in conjunction with the accompanying drawings.

DETAILED DESCRIPTION OF THE PREFERRED EMBODIMENT

The fabrication of a thin film circuit integrating thick film resistor components thereon, in accordance with the present invention, involves a two-phase process. The first phase calls for the formation of thick film resistors over an insulating substrate (1), and the second phase is to produce a thin film circuit on the substrate (1) with the thick film resistor components in existence.

Figure 1:
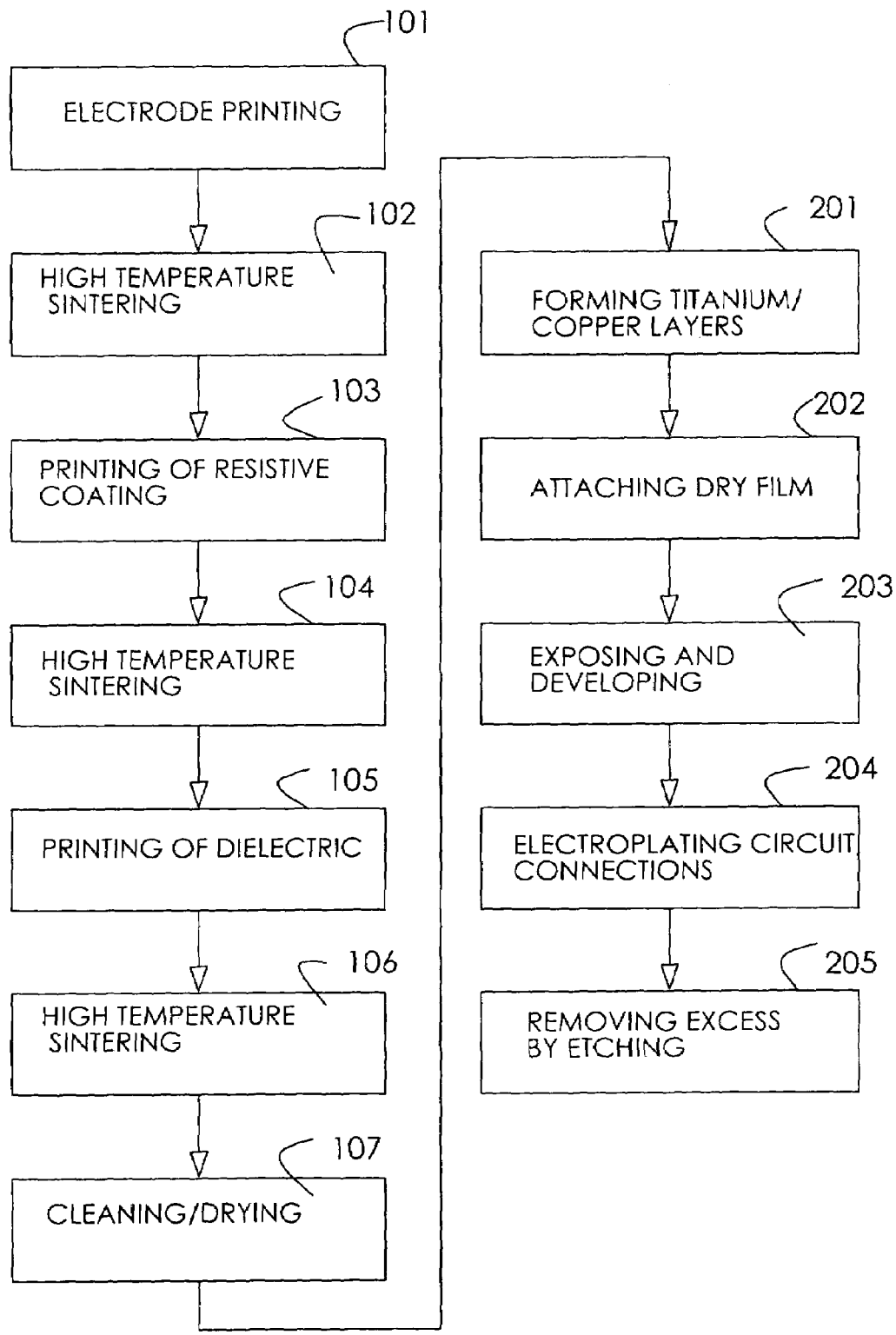
FIG. 1 is a flow chart for the present invention.

The process flow for the fabrication of a thin film circuit is shown in FIG. 1, where the first phase for forming thick film resistors includes printing conductive electrodes (101); high temperature sintering (102); printing a resistive coating for the thick film resistors (103); high temperature sintering (104); printing a passivation layer with a dielectric material (105); high temperature sintering (106); and cleaning and drying the thick film resistors (107). After the thick film resistors are formed, the second phase process calls for the formation of a thin film circuit, which includes forming a titanium layer and a copper layer (201); printing a dry film (202); exposing and developing (203), electroplating circuit interconnections (201); etching away remnants of the dry film and excessive metal materials (205).

Figure 2:
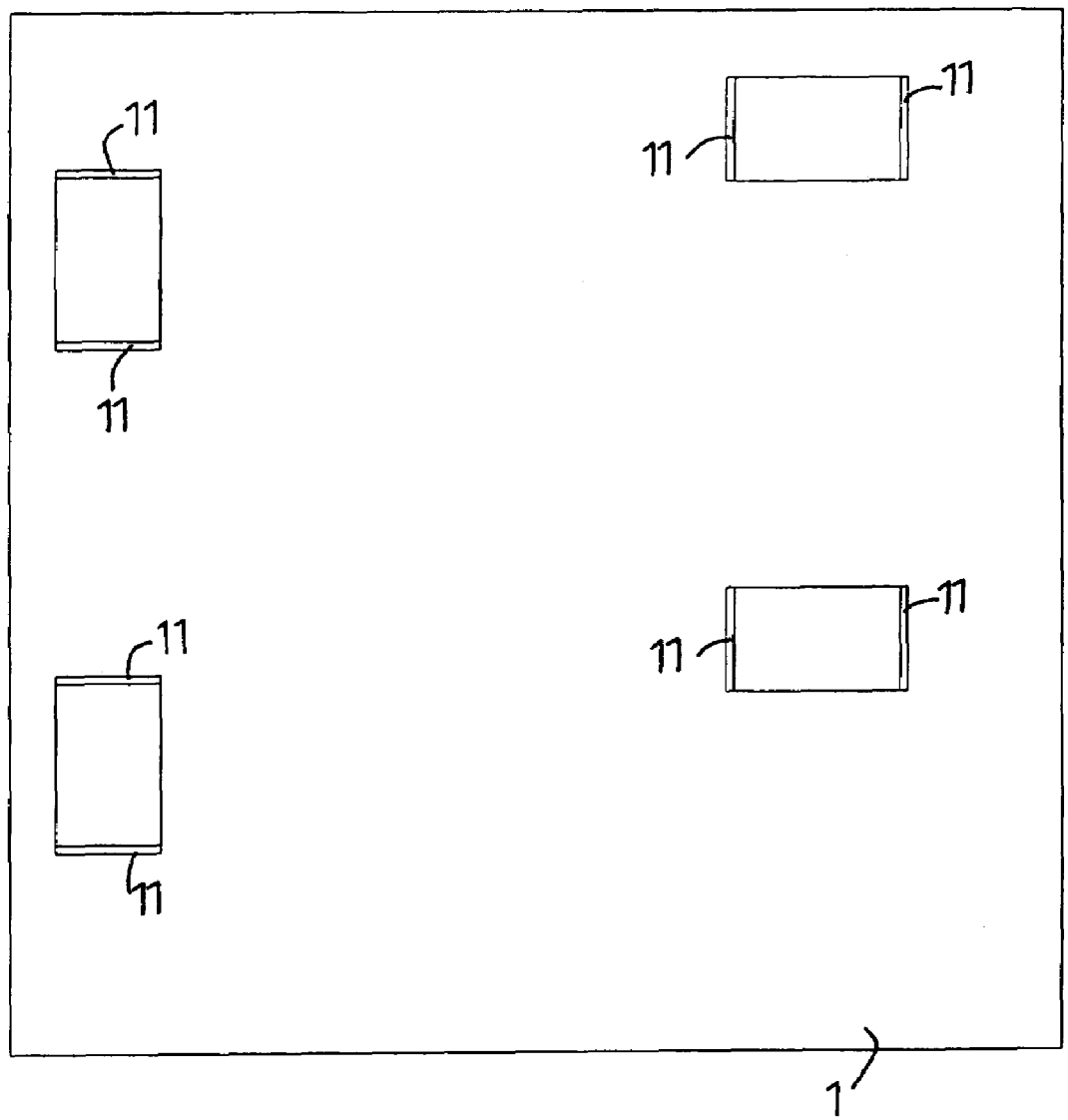
FIG. 2 is plan view of the formation of conductive electrodes on a substrate.
Figure 3:
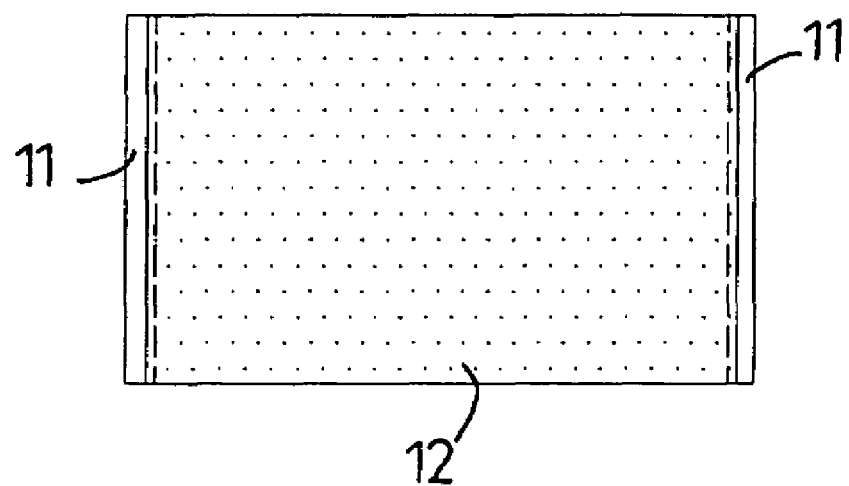
FIG. 3 is a plan view of the formation of resistive coating in between electrode pairs to form thick film resistors.

The detailed process of the first phase as shown in FIGS. 1, 2 for forming thick film resistors is described below.

The printing of pairs of conductive electrodes (11) on an insulating substrate (1) is targeted at predetermined positions where resistors are to be placed, and these electrodes (11) will become the end terminals of the resistors, and the thickness of the conductive coating is about 25±5 μm.

The high temperature sintering is used to set the electrodes (11) in place, using a temperature of 850 C for 50 min.

The printing of a layer of resistive coating (12) for thick film resistors, as shown in FIG. 2, is targeted at locations between the electrode pairs (11), where the resistance of the material selected and the thickness of the coating have a direct bearing on the resistance value of the resistors. Another factor affecting the resistance value of thick film resistors (12) is the distance between two electrodes (11). For example, if the shape of the resistive coating (12) between two electrodes (11) of the thick film resistor layer (12) is changed from a rectangular block to a continuous winding section, the effective length of the resistive coating (12) is increased considerably; hence the resistance value between this continuous winding section can be increased correspondingly.

The following step of high temperature sintering is used to set the resistive coating (12) in place, using a temperature of 850 C for 50 min.

Figure 4:
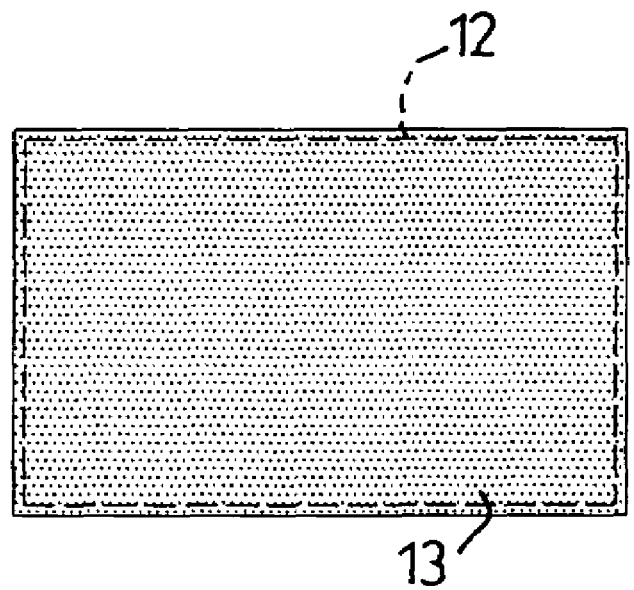
FIG. 4 is a plan view of the formation of a passivation layer over the thick film resistors.

The printing of a passivation layer (13), as shown in FIG. 4, is performed over the thick film resistors (12), and the thickness of the layer is about 18±3 μm. Since the resistance can also be affected by changes in ambient temperature and humidity, this is a low temperature process to form the dielectric layer over the resistors to protect them against outside influences such as changes in ambient temperature and humidity.

The following step of high temperature sintering is used to set the passivation layer (13) in place over the thick film resistors (12), the same as that used for the conductive electrodes (11).

The final step of cleaning and drying finishes up the formation of thick film resistors over the substrate (1).

Figure 5A:
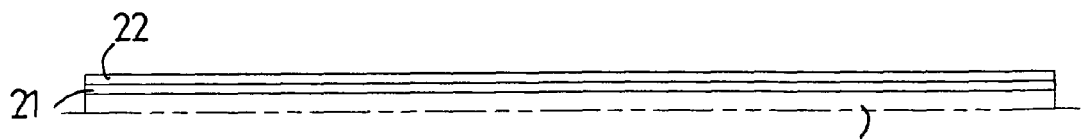
FIGS. 5A–5F represent the fabrication process for thin film circuits.

After forming the thick film resistor, the second phase for forming thin film circuit can be started, as shown in FIG. 5A.

The first step is the formation of titanium and copper layers (201) over the insulating substrate (1), wherein a titanium layer (21) is formed over the substrate (1) by a sputtering process, with thick film resistors in existence, and then a copper layer (22) is formed over the titanium layer (21), where the thickness of the titanium layer (21) is about 1000–1250 μm, and the copper layer (22) is about 4000 μm±10%.

Figure 5B:
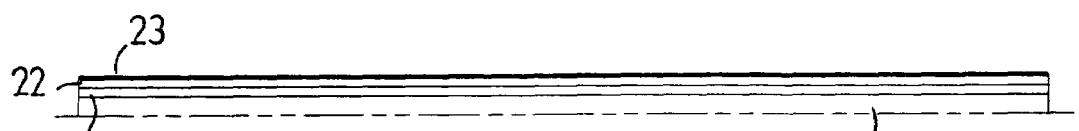

The next step calls for the attaching of a dry film (23), as shown in FIG. 5B, over the copper layer (22), where the dry film (23) is a polymer based resin that will become reactive when exposed to ultraviolet rays.

Figure 5C:
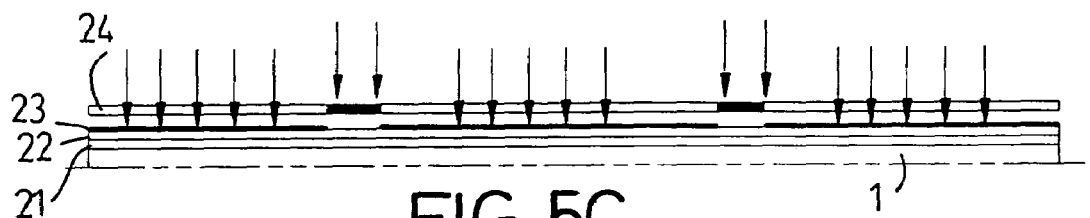

Before exposing the circuit portion, a photomask (24) is first aligned and placed over the circuit portion of the dry film (23) to form a photo resist layer against subsequent lithographic etching, and then the dry film (23) is placed under ultraviolet rays to cause polymerization. Since the circuit portion is shielded by the photomask (24), the ultraviolet rays cannot penetrate the photomask (24). The portion of the dry film (23) covering the circuit portion will not be subjected to ultraviolet rays and no polymerization results, as shown in FIG. 5c.

The developing process (203) involves the use of a developing solution to remove the portion of the dry film (23) without polymerization (that is, the locations for setting the circuit pattern), using an etching process to expose, the copper layer (22) representing the circuit pattern, so that the circuits can be produced with planar effect and fine shape.

Figure 5D:
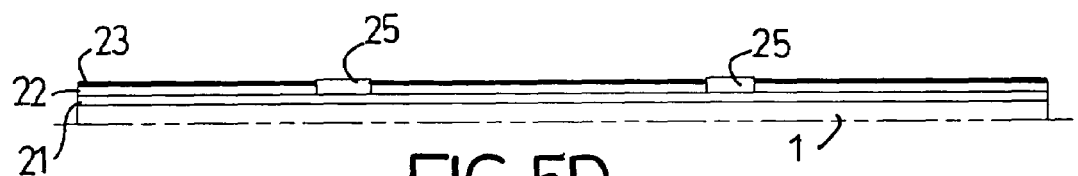

The next step calls for the electroplating the exposed circuit pattern, as shown in FIG. 5D to produce desired interconnections, forming a plated copper circuit (25) having an appropriate thickness.

Figure 5E:
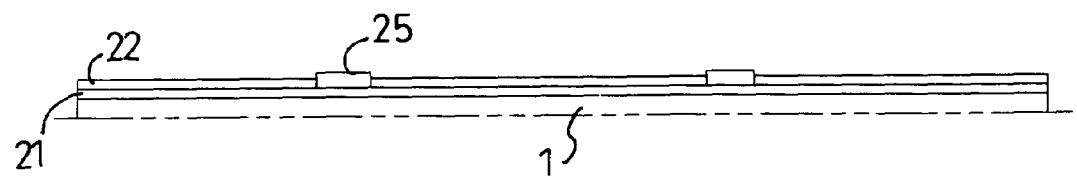
Figure 5F:

The last step of removing remnants of dry film (23) over the substrate (1) as shown in FIG. 5E is to use lithographic etching or other means. Also, excess amounts of the copper layer (22) and the titanium layer (21) other than those required for the plated copper circuit (25) are removed to produce the hybrid thin film circuit.

Figure 6:
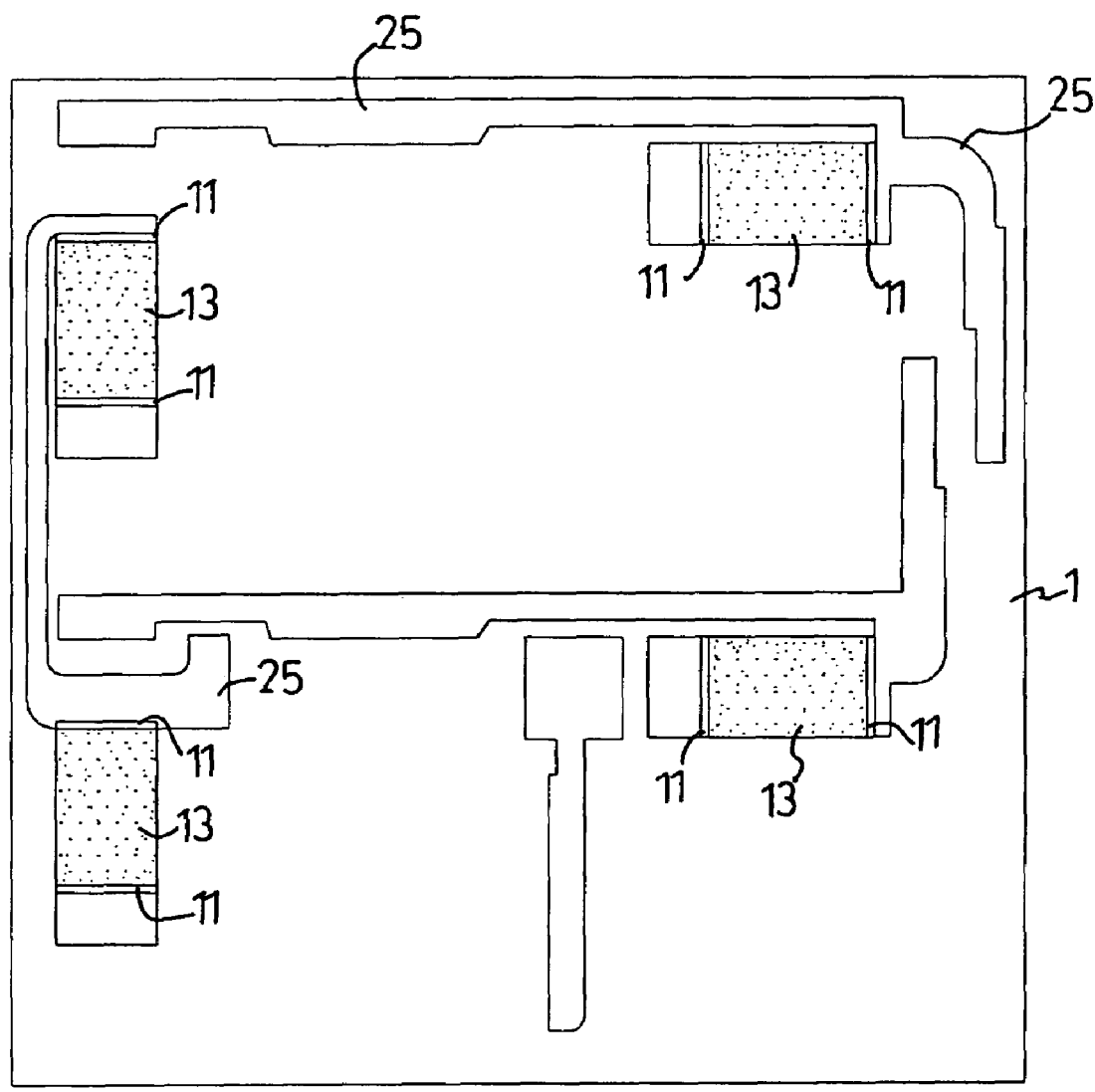
FIG. 6 is a plan view of a thin film circuit incorporating thick film resistors.

As shown in FIG. 6, each thick film resistor over the substrate (1) can be connected to the corresponding position on the thin film circuit through the electrodes (11).

It should be emphasized that even though in the present example the thick film resistor components and thin film circuit are all formed on the same surface over a substrate (1), the same process can be applied to create a double sided circuit board integrating the thick film resistor components and the thin film circuit portion on both sides of the substrate (1).

From the above description, the fabrication of the thin film circuit with the integrated thick film resistors does not need the drilling of holes on the substrate nor the electroplating of the lead wires. Therefore, the fabrication process of printed circuit boards can be automated to a greater extent than that with the conventional SMT technique.

The foregoing description of the preferred embodiments of the present invention is intended to be illustrative only and, under no circumstances, should the scope of the present invention be so restricted.

What is claimed is:

1. A method of fabricating a thin integrated film circuit with thick film resistors, comprising steps of:
   forming multiple pairs of conductive electrodes as terminals of thick film resistors on a substrate, wherein the two conductive electrodes of the same pair are separated by a distance and extend parallel to each other;
   forming a resistive coating on the substrate between each pair of conductive electrodes to form a thick film resistor;
   forming a passivation layer over the thick film resistors, where a low temperature process is used to form a dielectric layer as the passivation layer to protect the thick film resistors;
   forming a titanium layer and a copper layer sequentially over the substrate with the thick film resistors;
   attaching a dry film as over the copper layer;
   providing a photomask over the dry film;
   forming a circuit pattern on the dry film by an exposing process;
   electroplating a copper plated circuit on the circuit pattern that connects to the thick film resistors;
   removing remnants of the dry film and excess portions of the copper layer and titanium layer from the substrate to form thin film circuit.

2. The method as claimed in claim 1, wherein the forming of the conductive electrodes, the resistive coating, and the passivation layer all require a high temperature sintering or baking process after finishing the coating.

3. The method as claimed in claim 2, wherein the forming of the conductive electrodes, the resistive coating and the passivation layer all use a screen printing technique.

4. The method as claimed in claim 3, wherein the titanium layer and the copper layer are formed by a sputtering process.

5. The method as claimed in claim 1, wherein conductive electrodes have a thickness of 25±5 μm.

6. The method as claimed in claim 1, wherein the passivation layer has a thickness of 18±3 μm.

* * * * *